(12) United States Patent
Aremallapur (10) Patent No.: US 10,205,455 B2
(45) Date of Patent: *Feb. 12, 2019

(54) UNIVERSAL OSCILLATOR (71) Applicant: TEXAS INSTRUMENTS INCORPORATED, Dallas, TX (US)

(72) Inventor: Nagalinga Swamy Basayya Aremallapur, Haveri (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 137 days.

This patent is subject to a terminal disclaimer.

(21) Appl. No.: 15/244,202

(22) Filed: Aug. 23, 2016

(65) Prior Publication Data
US 2016/0359490 A1 Dec. 8, 2016

Related U.S. Application Data (63) Continuation of application No. 14/582,263, filed on Dec. 24, 2014, now Pat. No. 9,455,720.

(51) Int. Cl.
| | |
|---|---|
| H03L 7/00 | (2006.01) |
| H03B 5/32 | (2006.01) |
| H03K 3/03 | (2006.01) |
| H03L 7/099 | (2006.01) |
| H03L 7/085 | (2006.01) |

(52) U.S. Cl.
CPC ............... *H03L 7/00* (2013.01); *H03B 5/32* (2013.01); *H03K 3/0307* (2013.01); *H03K 3/0315* (2013.01); *H03L 7/099* (2013.01); *H03L 7/085* (2013.01)

(58) Field of Classification Search
CPC ........... H03B 5/06; H03B 5/32; H03K 3/0315

USPC ......... 331/158, 57, 116 FE, 183, 182, 116 R
See application file for complete search history.

(56) References Cited

U.S. PATENT DOCUMENTS

| | | | |
|---|---|---|---|
| 5,208,558 A | 5/1993 | Shigehara et al. | |
| 5,909,152 A * | 6/1999 | Li | H03B 5/36 331/116 FE |
| 6,118,348 A * | 9/2000 | Narahara | H03K 3/0307 331/116 FE |
| 7,009,458 B2 | 3/2006 | Gazit | |
| 7,042,298 B2 * | 5/2006 | Nakahi | H03K 3/014 331/158 |
| 7,142,042 B1 | 11/2006 | Henry | |
| 9,455,720 B2 * | 9/2016 | Aremallapur | H03K 3/0307 |
| 2008/0048901 A1 | 2/2008 | Cormier | |
| 2009/0231672 A1 | 9/2009 | Rothenbury | |

(Continued)

OTHER PUBLICATIONS

International Search Report from corresponding PCT Application No. PCT/US2015/067743, dated Apr. 28, 2016 (2 pages).

(Continued)

*Primary Examiner* — Arnold Kinkead
(74) *Attorney, Agent, or Firm* — John R. Pessetto; Charles A. Brill; Frank D. Cimino (57) ABSTRACT

The disclosure provides a universal oscillator. The oscillator includes an amplifier array. The amplifier array includes one or more amplifiers. A control logic unit is coupled to the amplifier array and activates the one or more amplifiers. A self-clock generating circuit is coupled to the control logic unit and generates a fixed clock. A counter receives the fixed clock from the self-clock generating circuit and provides a controlled clock to the control logic unit.

20 Claims, 5 Drawing Sheets

(56) References Cited

U.S. PATENT DOCUMENTS

| | | |
|---|---|---|
| 2012/0026813 A1 | 2/2012 | Sato |
| 2013/0335157 A1* | 12/2013 | Ishii .................... H01L 41/0475 |
| | | 331/158 |
| 2014/0320223 A1 | 10/2014 | Ozawa et al. |
| 2014/0333375 A1 | 11/2014 | Karthaus |

OTHER PUBLICATIONS

Supplementary European Search Report in corresponding European Patent Application No. EP15874376.5, dated Sep. 8, 2017 (4 pages).

* cited by examiner

UNIVERSAL OSCILLATOR

CROSS-REFERENCE TO RELATED APPLICATION(S)

This continuation application claims priority to U.S. patent application Ser. No. 14/582,263, filed Dec. 24, 2014, which application is incorporated herein by reference.

TECHNICAL FIELD

The present disclosure relates generally to integrated circuits, and more particularly to a universal oscillator for use with an integrated circuit.

BACKGROUND

The processing systems on an integrated circuit require clock signals for timing and synchronization. Crystal oscillators or ceramic resonators are widely used for obtaining these clock signals. A crystal oscillator includes a crystal that implements a piezoelectric effect of converting mechanical vibrations to electrical impulses. When alternating currents or voltages are applied to the crystal, it will vibrate at a resonant frequency, and harmonic modes thereof. To initiate and amplify the piezoelectric effect, an oscillator circuit is coupled to the crystal. A frequency of the generated oscillator signal is governed by multiple factors including a type of crystal.

The ceramic resonators are variable frequency oscillators that include a piezoelectric ceramic material. When an oscillator circuit is coupled to the ceramic material, the resonant mechanical vibrations in the device generate an oscillator signal of a specific frequency. Different types of crystals and ceramics are used to generate multiple oscillator signals based on the application domain.

However, the oscillator circuit coupled to a crystal or ceramic material for initiating and amplifying the oscillation varies with the type of crystal or ceramic material. Thus, an oscillator circuit used with a quartz crystal is not compatible with certain ceramic material. An integrated circuit generally requires multiple oscillator circuits to support multiple integrated devices functioning at different clock frequencies. Therefore, multiple pads are provided on these integrated circuits to support multiple oscillator circuits. This increases a number of pins used on the integrated circuit.

SUMMARY

According to one aspect of the disclosure, an oscillator is provided. The oscillator includes an amplifier array which further includes one or more amplifiers. A control logic unit is coupled to the amplifier array and activates the one or more amplifiers. A self-clock generating circuit is coupled to the control logic unit and generates a fixed clock. A counter receives the fixed clock from the self-clock generating circuit and provides a controlled clock to the control logic unit.

DETAILED DESCRIPTION OF THE EMBODIMENTS

Figure 1:
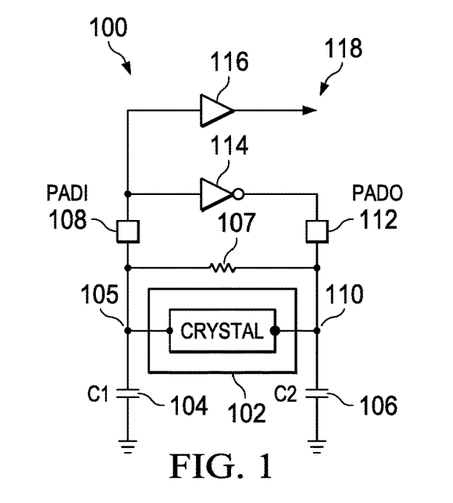
FIG. 1 illustrates an oscillator.

FIG. 1 illustrates a crystal oscillator 100. The crystal oscillator 100 includes a crystal 102, a first capacitance C1 104, a second capacitance C2 106, a bias resistor 107, an input pad PADI 108, an output pad PADO 112, an inverting amplifier 114 and a buffer 116. The crystal 102 is connected across the inverting amplifier 114 and the bias resistor 107. The first capacitance C1 104 is coupled between a first end 105 of the crystal 102 and a ground terminal. The second capacitance C2 106 is coupled between a second end 110 of the crystal 102 and the ground terminal.

The bias resistor 107 is coupled across the first end 105 and the second end 110. The input pad PADI 108 is coupled to the first end 105 and the output pad PADO 112 is coupled to the second end 110. The inverting amplifier 114 is connected across the input pad PADI 108 and the output pad PADO 112. The buffer 116 is coupled to the input pad PADI 108 and generates an output signal 118.

The operation of the crystal oscillator 100 illustrated in FIG. 1 is explained now. The crystal 102 is a material that generates oscillation signals in response to an activation signal provided by the inverting amplifier 114. The first capacitance C1 104 and the second capacitance C2 106 provide stability to the crystal oscillator 100 during PTV (process, temperature and voltage) variations. The bias resistor 107 provides a common mode bias for an operating point of the inverting amplifier 114 and increases its gain.

The inverting amplifier 114 amplifies the oscillation signals generated by the crystal 102 to a defined frequency. In one example, the defined frequency is determined by inductor and capacitor (LC) parallel/series resonance in the crystal 102. These tuned oscillations are provided to the buffer 116 to generate the output signal 118 which is at the defined frequency. The crystal oscillator 100 generates the output signal 118 at the defined frequency. However, the crystal oscillator 100 requires a different crystal 102 to generate an output signal 118 at a different frequency. Thus, the crystal oscillator 100 is not capable of supporting an integrated circuit that requires multiple clock frequencies.

Figure 2:
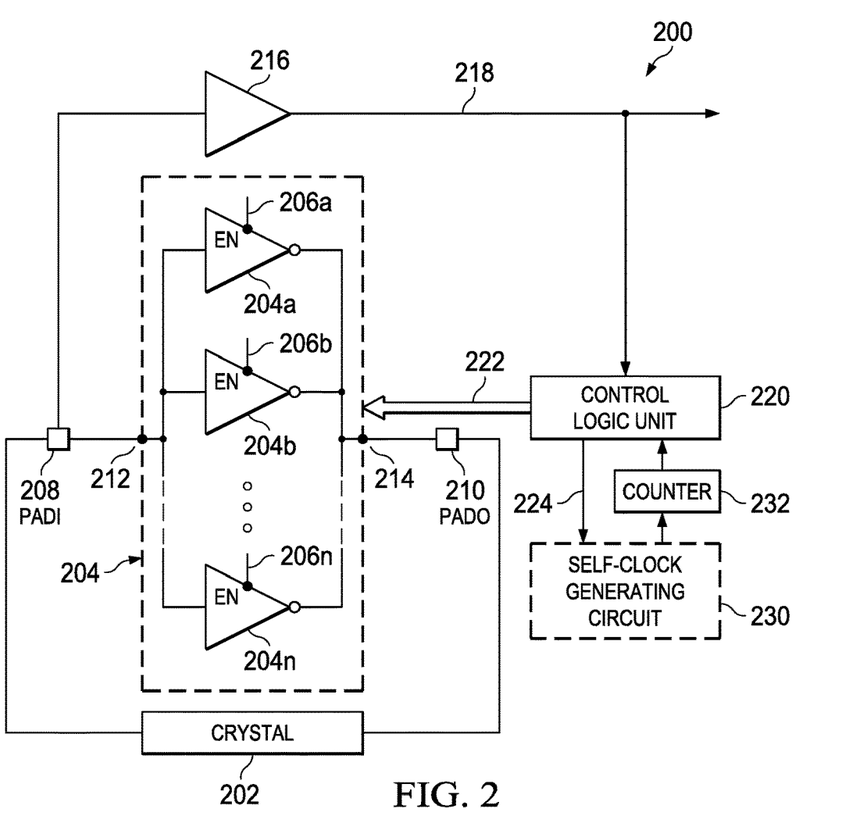
FIG. 2 illustrates an oscillator, according to an embodiment.

FIG. 2 illustrates an oscillator 200, according to an embodiment. The oscillator 200 includes an amplifier array 204, an input pad PADI 208, an output pad PADO 210, a buffer 216, a control logic unit 220, a self-clock generating circuit 230 and a counter 232. The amplifier array 204 includes one or more amplifiers depicted as 204a, 204b till 204n.

Each amplifier of the one or more amplifiers includes an enable port EN. Each amplifier is activated or de-activated by a control signal received from the control logic unit 220. The control signal is received at the enable port EN of an amplifier. For example, the amplifier 204a receives the control signal 206a and the amplifier 204b receives the control signal 206b. Similarly the amplifier 204n receives the control signal 206n.

A first end 212 of the amplifier array 204 is coupled to the input pad PADI 208, and a second end 214 of the amplifier array 204 is coupled to the output pad PADO 210. A crystal 202 is coupled across the input pad PADI 208 and the output pad PADO 210. Thus, the crystal 202 is coupled across the amplifier array 204. In one version, a ceramic material is coupled across the amplifier array 204. The buffer 216 is coupled to the amplifier array 204 through the input pad PADI 208 and generates an output signal 218. In one example, the buffer 216 is coupled to the amplifier array 204 through the output pad PADO 210.

The control logic unit 220 receives the output signal 218. The control logic unit 220 is coupled to the amplifier array 204 and provides control signals 222 to the one or more amplifiers in the amplifier array 204. The self-clock generating circuit 230 is coupled to the control logic unit 220. The counter 232 is coupled to the self-clock generating circuit 230, and the control logic unit 220 is coupled to the counter 232. The oscillator 200 may include one or more additional components known to those skilled in the relevant art and are not discussed here for simplicity of the description.

The operation of the oscillator 200 illustrated in FIG. 2 is explained now. The control logic unit 220 provides an enable signal 224 to the self-clock generating circuit 230. The enable signal 224 activates the self-clock generating circuit 230. In one version, when power is provided to the oscillator 200, the self-clock generating circuit 230 is activated. The self-clock generating circuit 230 generates a fixed clock which is provided to the counter 232. In one example, the self-clock generating circuit 230 is a ring oscillator. The counter 232 generates a controlled clock in response to the fixed clock and the controlled clock is provided to the control logic unit 220. The controlled clock acts as a time-keeper for the control logic unit 220.

The controlled clock is required for smooth functioning of the control logic unit 220. The crystal 202 is a material that generates oscillation signals in response to an activation signal provided by the amplifier array 204. In one version, a ceramic material is used instead of the crystal 202.

In one example, a capacitance is coupled between the input pad PADI 208 and a ground terminal, and a capacitance is coupled between the output pad PADO 210 and the ground terminal (not illustrated in the figure). These capacitance provides stability to the oscillator 200 during PTV (process, temperature and voltage) variations.

The oscillation signals generated by the crystal 202 are provided to the buffer 216 to generate the output signal 218. The output signal 218 is provided as a feedback to the control logic unit 220. The control logic unit 220 activates one or more amplifiers in the amplifier array 204 in response to the output signal 218.

The control logic unit 220 provides control signals 222 to the amplifier array 204. The control signals 222 includes control signal 206a, 206b till 206n. In one version, the control signal is a logic high signal to activate an amplifier. For example, when the control signal 206a is at logic high, the amplifier 204a is activated. In another version, the control signal is a logic low signal to activate an amplifier. The amplifier array 204 provides stability to the oscillator 200 during PTV variations.

The control logic unit 220 activates one on more amplifiers such that the amplifier array 204 builds oscillations across the crystal 202 at a desired frequency. The desired frequency is a resonant frequency of the oscillator 200. Thus, the output signal 218 is an oscillating signal at the desired frequency. Also, the functioning of the oscillator 200 is independent of a type of crystal used as the crystal 202. In one version, a ceramic material is used instead of the crystal 202. The control logic unit 220 activates one or more amplifiers in the amplifier array 204 to build the oscillations across the ceramic material. The output signal 218, thus generated is an oscillating signal at the desired frequency.

The control logic unit 220 dynamically configures the oscillator 200 based on the type of the crystal 202 used in the oscillator 200. Therefore, the oscillator 200 is able to support an integrated circuit that requires support for multiple crystals (and/or resonators) and also for different clock frequencies. The oscillator 200 supports a wide range of specifications of the crystal 202.

In one embodiment, the crystal is not embedded in the integrated circuit. A substrate is utilized that includes the crystal 202 and an integrated circuit. The integrated circuit includes the amplifier array 204, the control logic unit 220, the self-clock generating circuit 230 and the counter 232. The crystal 202 is connected across the amplifier array 204. Thus, an SoC (with the integrated circuit) is capable of functioning across different environments in terms of crystal selection and programmability as per the application. The integrated circuit also provides support when a ceramic material is connected across the amplifier array 204.

Figure 3:
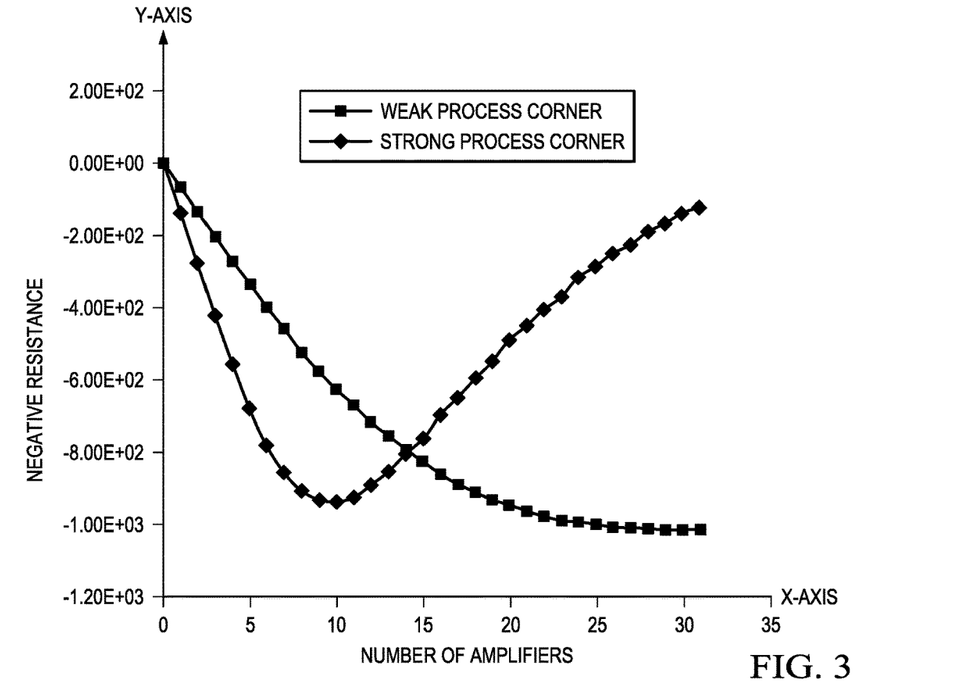
FIG. 3 illustrates a negative resistance plot for the oscillator illustrated in FIG. 2, according to an embodiment.

FIG. 3 illustrates a negative resistance plot for the oscillator 200, according to an embodiment. The x-axis on the plot illustrates a number of amplifiers in the amplifier array 204. The y-axis on the plot illustrates negative resistance. The crystal 202 in the oscillator 200 offers a resistance to the rest of the circuit. Thus, the amplifier array 204 is required to provide a negative resistance to overcome the resistance offered by the crystal 202 in order to build oscillations. Thereafter, the oscillator 200 is able to sustain the oscillations generated by the crystal 202.

The plot illustrates a number of amplifiers required to overcome the resistance offered by the crystal 202 in weak process corner and strong process corner. Process corners indicate variation of fabrication parameters used in applying an integrated circuit design to a semiconductor wafer. Strong and weak process corners represent the extremes of these parameter variations within which a circuit that has been etched onto the semiconductor wafer functions correctly. In addition, voltage and temperature variations are also considered in determining strong and weak process corners.

The lower the negative resistance in an oscillator, the better is the performance and specification of the oscillator. The oscillator can support crystals with higher ESR (Effective series resistance). As illustrated, for the strong process corner, a minimum negative resistance is achieved when a number of amplifiers activated in the amplifier array 204 is 10. Similarly, for the weak process corner, a minimum negative resistance is achieved when a number of amplifiers activated in the amplifier array 204 is 27.

The number of amplifiers also represents a drive strength of an oscillator. Thus, the oscillator 200 provides a drive strength of 10 in the strong process corner to achieve best performance. The oscillator 200 provides a drive strength of 27 in the weak process corner to achieve best performance. Thus, for a given fabrication parameters, a number of amplifiers required in the oscillator 200 can be adjudged before actual fabrication of the integrated circuits. Also, the oscillator 200 is capable of dynamic re-configuration to adapt to changes in process conditions. As a result, a number of amplifiers activated in the amplifier array 204 is determined by the control logic unit 220 based on the process conditions.

Figure 4:
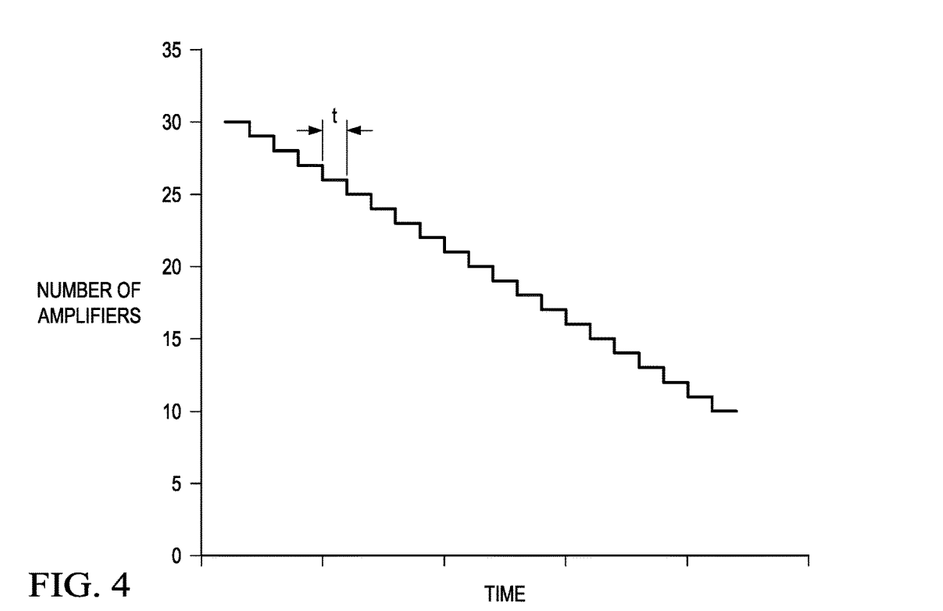
FIG. 4 is a graph to illustrate the operation of a control logic unit, according to an embodiment.

FIG. 4 is a graph to illustrate the operation of a control logic unit, according to an embodiment. The control logic unit 220 in the oscillator 200 is used for explaining the graph illustrated in FIG. 4. The x-axis on the graph illustrates time. The y-axis on the graph illustrates a number of amplifiers in the amplifier array 204.

For ease of explanation, the figure illustrates the operation of control logic unit 220 when a number of amplifiers in the amplifier array 204 is 30. The number 30 is used for ease of explanation and is understood not to limit the scope of the present disclosure. The control logic unit 220 on receiving the controlled clock from the counter 232 activates the 30 amplifiers in the amplifier array 204.

The time t illustrates the time for which the control logic unit 220 will remain in one state. Thereafter, the control logic unit 220 deactivates one amplifier. Thus, after time t, 29 amplifiers will remain active. If the control logic unit 220 does not detect oscillations when 30 amplifier are active, then after time t, one amplifier is deactivated by the control logic unit 220.

This process is repeated till the control logic unit 220 detects oscillations. The graph illustrates the sequence followed by the control logic unit 220 in deactivating the amplifiers in the amplifier array 204. In one example, the control logic unit 220 deactivates N amplifiers after every time t. In another example, the control logic unit 220 deactivates a variable set of amplifiers after time t.

Figure 5A:
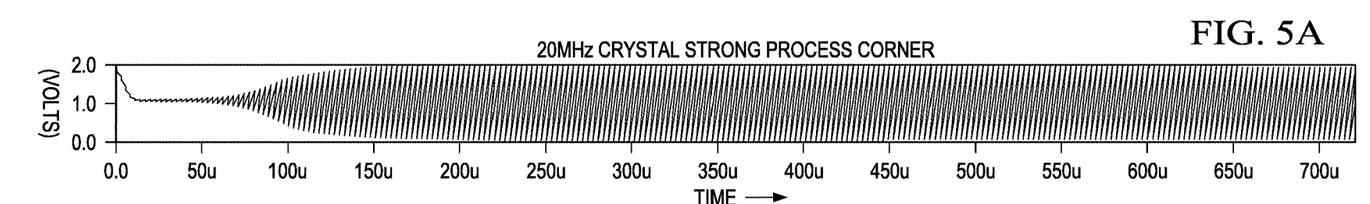
FIG. 5A-5F are graphs illustrating signal waveforms generated by the oscillator illustrated in FIG. 2, according to an embodiment.
Figure 5B:
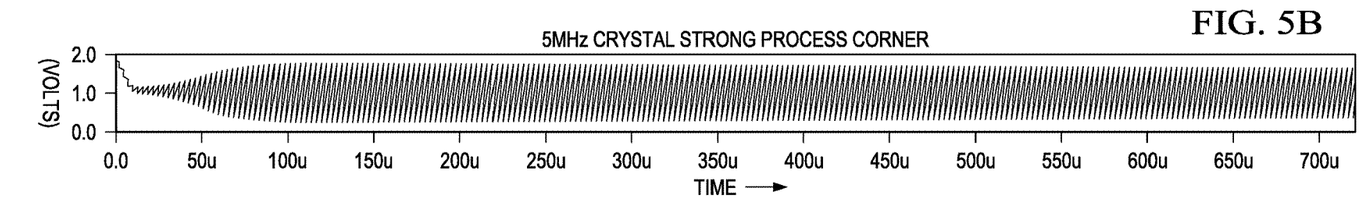

FIG. 5A-5F are graphs illustrating signal waveforms generated by the oscillator 200, according to an embodiment. The figure provides a start-up time for the oscillator 200 when different crystal or ceramic material are used as crystal 202. The FIG. 5A illustrates a start-up time when a 20 MHz crystal is used in a strong process corner, and the FIG. 5B illustrates a start-up time when a 5 MHz crystal is used in a strong process corner. As illustrated, a sustained oscillation is obtained in the 5 MHz crystal as well as 20 MHz crystal using same oscillator 200.

Figure 5C:
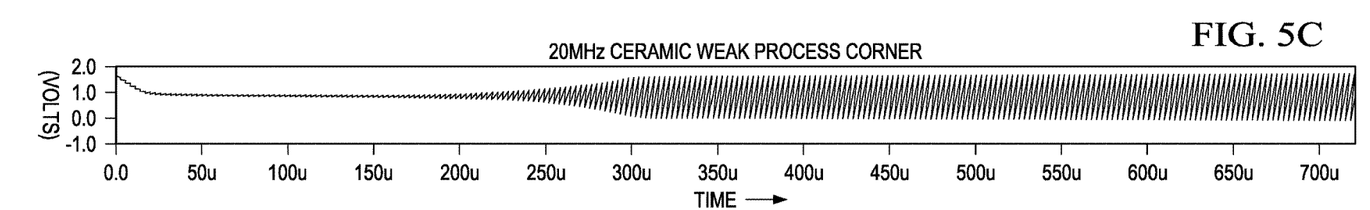

The oscillator 200 also supports ceramic materials. FIGS. 5C and 5E respectively illustrate a start-up time when 20 MHz ceramic material and 5 MHz ceramic material are used in a weak process corner. As illustrated, a sustained oscillation is obtained in 5 MHz ceramic material and in the 20 MHz ceramic material using same oscillator 200.

Figure 5D:
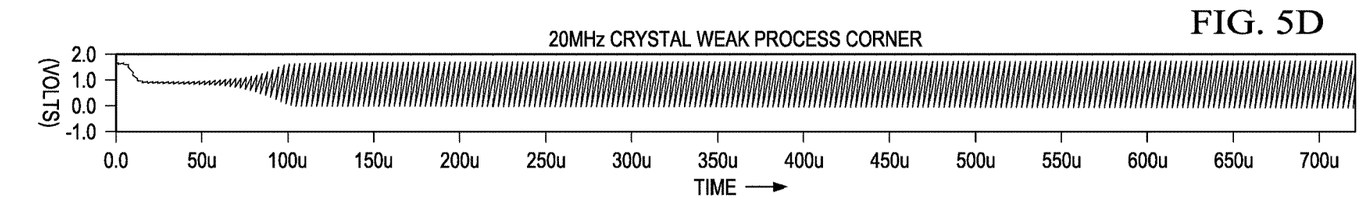
Figure 5E:
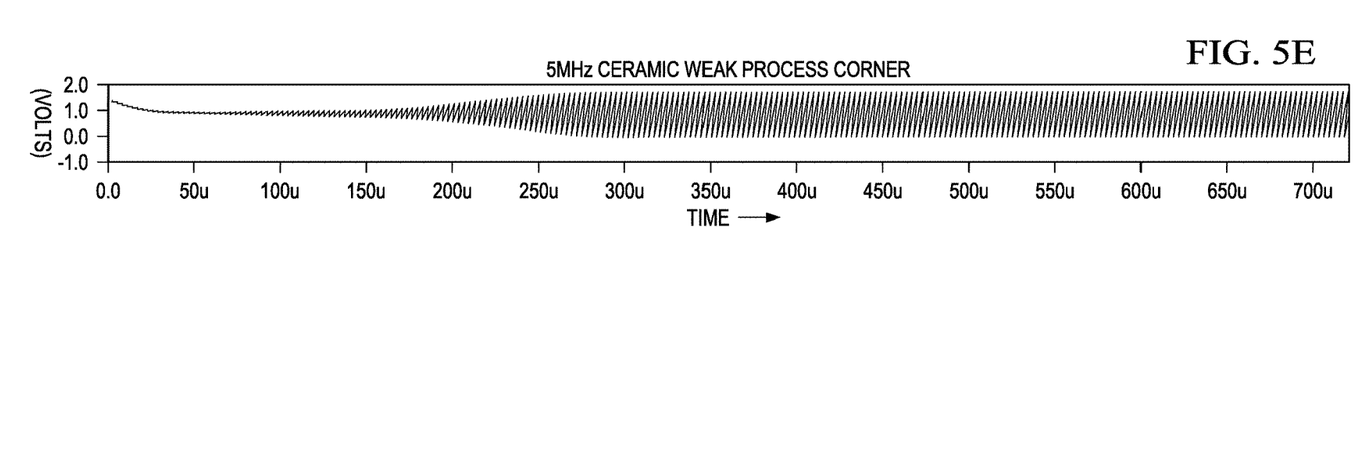
Figure 5F:
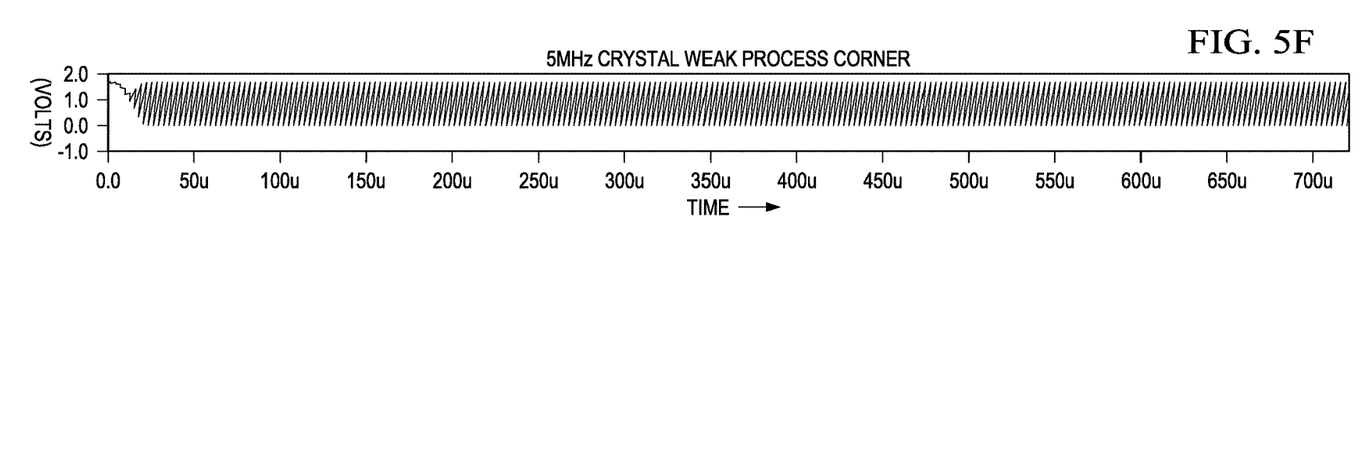

The FIG. 5D illustrates a start-up time when a 20 MHz crystal is used in a weak process corner, and the FIG. 5F illustrates a start-up time when a 5 MHz crystal is used in a weak process corner.

Figure 6:
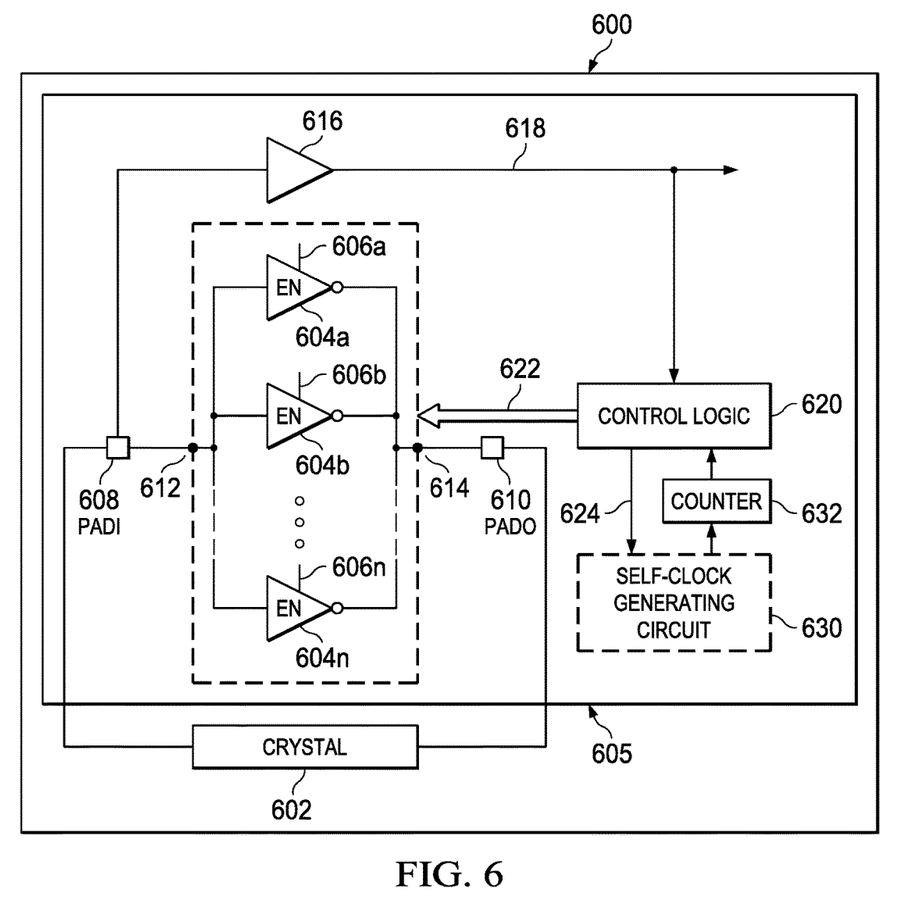
FIG. 6 illustrates a substrate, according to an embodiment.

FIG. 6 illustrates a substrate 600, according to an embodiment. The substrate 600 includes a crystal 602 and an integrated circuit 605. In one version, the substrate 600 includes a ceramic material and an integrated circuit 605. The ceramic material replaces the crystal 602. The integrated circuit 605 includes an amplifier array 604, an input pad PADI 608, an output pad PADO 610, a buffer 616, a control logic unit 620, a self-clock generating circuit 630 and a counter 632. The amplifier array 604 includes one or more amplifiers depicted as 604a, 604b till 604n.

Each amplifier of the one or more amplifiers includes an enable port EN. Each amplifier is activated or de-activated by a control signal received from the control logic unit 620. The control signal is received at the enable port EN of an amplifier. For example, the amplifier 604a receives the control signal 606a and the amplifier 604b receives the control signal 606b. Similarly the amplifier 604n receives the control signal 606n.

A first end 612 of the amplifier array 604 is coupled to the input pad PADI 608, and a second end 614 of the amplifier array 604 is coupled to the output pad PADO 610. A crystal 602 is coupled across the input pad PADI 608 and the output pad PADO 610. Thus, the crystal 602 is coupled across the amplifier array 604. In one version, a ceramic material is coupled across the amplifier array 604. The buffer 616 is coupled to the amplifier array 604 through the input pad PADI 608 and generates an output signal 618.

The control logic unit 620 receives the output signal 618. The control logic unit 620 is coupled to the amplifier array 604 and provides control signals 622 to the one or more amplifiers in the amplifier array 604. The self-clock generating circuit 630 is coupled to the control logic unit 620. The counter 632 is coupled to the self-clock generating circuit 630 and the control logic unit 620 is coupled to the counter 632. The substrate 600 may include one or more additional components known to those skilled in the relevant art and are not discussed here for simplicity of the description.

The crystal 602 along with other components on the integrated circuit 605 together constitutes the oscillator 200 discussed in connection with FIG. 2. The operation of the oscillator on the substrate 600 is similar to the operation of the oscillator 200 illustrated in FIG. 2 and hence is not explained again for brevity of the description. A SoC (with the integrated circuit 605) is capable of functioning across different environments in terms of crystal selection and programmability as per the application. The integrated circuit 605 also provides support when a ceramic material is connected across the amplifier array 604.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An oscillator comprising:
an amplifier array comprising one or more amplifiers;
a buffer coupled to the amplifier array and configured to generate an output signal;
a control logic unit coupled between the buffer and the amplifier array and configured to receive the output signal as a feedback; and
a self-clock generating circuit coupled to the control logic unit, the self-clock generating circuit configured to generate a fixed clock, wherein the control logic unit is configured to activate the one or more amplifier based on the output signal and a controlled clock, and wherein the controlled clock is generated from the fixed clock.

2. The oscillator of claim 1 further comprising a crystal coupled across the amplifier array.

3. The oscillator of claim 1 further comprising a ceramic material coupled across the amplifier array.

4. The oscillator of claim 1 further comprising a counter coupled between the self-clock generating circuit and the control logic unit, the counter configured to receive the fixed clock from the self-clock generating circuit and configured to provide the controlled clock to the control logic unit.

5. The oscillator of claim 1, wherein each amplifier of the one or more amplifiers comprises an enable port coupled to the control logic unit.

6. The oscillator of claim 5, wherein the control logic unit is configured to provide a control signal on the enable port of an amplifier to activate the amplifier.

7. The oscillator of claim 1, wherein the self-clock generating circuit is a ring oscillator.

8. The oscillator of claim 1, wherein the output signal is an oscillating signal at a desired frequency.

9. The oscillator of claim 1, wherein the control logic unit is configured to provide an enable signal to the self-clock generating circuit, the enable signal is configured to activate the self-clock generating circuit to generate the fixed clock.

10. A method comprising:
generating a fixed clock by a self-clock generating circuit;
generating a controlled clock from the fixed clock;
generating an output signal at a desired frequency; and
activating one or more amplifiers in an amplifier array in response to the output signal and the controlled clock.

11. The method of claim 10, wherein the self-clock generating circuit is a ring oscillator.

12. The method of claim 10 further comprising coupling one of a crystal and a ceramic material across the amplifier array.

13. The method of claim 10 further comprising generating the output signal from a buffer coupled to the amplifier array, and the output signal is an oscillating signal at the desired frequency.

14. The method of claim 10 further comprising providing the output signal as a feedback to a control logic unit and activating the one or more amplifiers based on the output signal and the controlled clock such that the output signal is at the desired frequency.

15. The method of claim 14 further comprising activating the self-clock generating circuit by an enable signal provided by the control logic unit.

16. The method of claim 14 further comprising providing a control signal by the control logic unit to activate an amplifier of the one or more amplifiers.

17. A substrate comprising:
one of a crystal and a ceramic material; and
an integrated circuit coupled to one of the crystal and the ceramic material, the integrated circuit comprising:
an amplifier array comprising one or more amplifiers;
a buffer coupled to the amplifier array and configured to generate an output signal;
a control logic unit coupled between the buffer and the amplifier array and configured to receive the output signal as a feedback; and
a self-clock generating circuit coupled to the control logic unit, the self-clock generating circuit configured to generate a fixed clock, wherein the control logic unit is configured to activate the one or more amplifier based on the output signal and a controlled clock, and wherein the controlled clock is generated from the fixed clock.

18. The substrate of claim 17, wherein one of the crystal and the ceramic material is connected across the amplifier array.

19. The substrate of claim 17, wherein each amplifier of the one or more amplifiers comprises an enable port coupled to the control logic unit, and the control logic unit is configured to provide a control signal on an enable port of an amplifier to activate the amplifier.

20. The substrate of claim 17, wherein the integrated circuit further comprises a counter coupled between the self-clock generating circuit and the control logic unit, the counter configured to receive the fixed clock from the self-clock generating circuit and configured to provide the controlled clock to the control logic unit.

* * * * *